United States Patent
Raitter

(10) Patent No.: US 6,792,365 B2
(45) Date of Patent: Sep. 14, 2004

(54) SEQUENTIAL UNIQUE MARKING

(75) Inventor: James S. Raitter, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 191 days.

(21) Appl. No.: 09/928,032

(22) Filed: Aug. 10, 2001

(65) Prior Publication Data

US 2003/0033101 A1 Feb. 13, 2003

(51) Int. Cl.$^7$ .............................................. G06F 19/00
(52) U.S. Cl. ...................................... 702/81; 382/145
(58) Field of Search ............................. 702/35, 80–84, 702/117, 118, 187, 188; 700/121, 218; 209/573; 382/145; 438/14, 15, 17, 108

(56) References Cited

U.S. PATENT DOCUMENTS

| | | | | |
|---|---|---|---|---|
| 4,027,246 A | | 5/1977 | Caccoma et al. | 700/121 |
| 4,454,413 A | * | 6/1984 | Morton, Jr. | 235/375 |
| 4,510,673 A | | 4/1985 | Shils et al. | 438/15 |
| 4,985,988 A | * | 1/1991 | Littlebury | 438/15 |
| 5,003,251 A | | 3/1991 | Fuoco | 324/764 |
| 5,043,657 A | | 8/1991 | Amazeen et al. | 438/18 |
| 5,118,369 A | | 6/1992 | Shamir | 156/64 |
| 5,173,766 A | * | 12/1992 | Long et al. | 257/687 |
| 5,175,774 A | | 12/1992 | Truax et al. | 382/145 |
| 5,197,650 A | | 3/1993 | Monzen et al. | 228/6.2 |
| 5,256,578 A | * | 10/1993 | Corley et al. | 438/17 |
| 5,289,113 A | | 2/1994 | Meaney et al. | 324/73.1 |
| 5,294,812 A | | 3/1994 | Hashimoto et al. | 257/65 |
| 5,301,143 A | | 4/1994 | Ohri et al. | 365/96 |
| 5,360,747 A | | 11/1994 | Larson et al. | 438/10 |
| 5,448,488 A | | 9/1995 | Oshima | 700/121 |
| 5,654,204 A | * | 8/1997 | Anderson | 438/15 |
| 5,801,067 A | | 9/1998 | Shaw et al. | 438/15 |
| 5,805,472 A | * | 9/1998 | Fukasawa | 702/118 |
| 5,834,838 A | * | 11/1998 | Anderson | 257/697 |
| 5,844,803 A | | 12/1998 | Beffa | 700/121 |
| 5,856,923 A | * | 1/1999 | Jones et al. | 700/121 |
| 5,907,492 A | | 5/1999 | Akram et al. | 700/121 |
| 5,915,231 A | | 6/1999 | Beffa | 702/118 |
| 5,927,512 A | * | 7/1999 | Beffa | 209/573 |
| 5,937,270 A | * | 8/1999 | Canella | 438/14 |
| 5,986,235 A | | 11/1999 | Canella | 219/121.68 |
| 6,015,722 A | * | 1/2000 | Banks et al. | 438/108 |
| 6,049,624 A | | 4/2000 | Wilson et al. | 382/145 |
| 6,100,486 A | | 8/2000 | Beffa | 209/573 |
| 6,122,563 A | | 9/2000 | Beffa | 700/121 |
| 6,136,137 A | * | 10/2000 | Farnworth et al. | 156/344 |
| 6,226,394 B1 | * | 5/2001 | Wilson et al. | 382/145 |
| 6,227,373 B1 | * | 5/2001 | Stuckey et al. | 209/3.1 |
| 6,230,896 B1 | * | 5/2001 | Lambert | 206/722 |
| 6,274,395 B1 | * | 8/2001 | Weber | 438/14 |
| 6,417,484 B1 | | 7/2002 | Canella et al. | |
| 6,449,531 B1 | * | 9/2002 | Gune et al. | 700/218 |
| 2002/0057963 A1 | * | 5/2002 | Peterson et al. | 414/798.1 |
| 2002/0066694 A1 | * | 6/2002 | Soh et al. | 206/725 |

* cited by examiner

Primary Examiner—Marc S. Hoff
(74) Attorney, Agent, or Firm—TraskBritt

(57) ABSTRACT

The present invention comprises a method of sequential unique marking comprising providing a multi-die handling device with a plurality of devices therein, reading an ID code on the multi-die handling device, retrieving a tray map file corresponding to the ID code, determining a tray matrix of the multi-die handling device, retrieving data from the tray map file, the data comprising unique characters correlating to each device of the plurality of devices and marking each device with the data 34 Claims, 3 Drawing Sheets

SEQUENTIAL UNIQUE MARKING

BACKGROUND OF THE INVENTION

Field of the Invention: The current invention relates generally to marking semiconductor dice having integrated circuits (ICs) and, more specifically, to a system for uniquely marking exterior surfaces of semiconductor dice in lots.

State of the Art: In conventional semiconductor device fabrication processes, a number of distinct semiconductor devices, such as memory chips or microprocessors, are fabricated on a semiconductor substrate, such as a silicon wafer. Each semiconductor wafer has a plurality of integrated circuit semiconductor dice (IC) arranged in rows and columns with the periphery of each IC being substantially rectangular or square. After the desired structures, circuitry, and other features of each of the semiconductor devices have been fabricated upon the semiconductor substrate, the substrate is typically singulated to separate the individual semiconductor devices from one another.

While semiconductor dice may carry information on the active surface thereof regarding the manufacturer, specifications, etc., such information cannot be easily read without the use of optical devices. Therefore, subsequent to the wafer dicing process, individual semiconductor dice are commonly subjected to a marking process wherein various easily read information is placed on the backside or inactive side of the semiconductor die for purposes of corporate identity, product differentiation and counterfeit protection.

Currently, the preferred method of marking packaged semiconductor dice is using a laser beam. Lasers are used to mark semiconductor dice with a manufacturer's logo, as well as alphanumeric marks and bar codes specifying the company's name, a part or serial number, or other information such as lot or die location. In particular, lasers have become especially useful in marking high volume production items such as bare or packaged semiconductor dice. The high speed and precision of laser marking makes their use highly desirable for high throughput automated processes. Unlike the previously utilized technique of ink stamping, laser marking is very fast, requires no curing time, produces a consistently high quality mark, and can take place at any point in the manufacturing process.

Traditionally, semiconductor devices are marked as a group of 25 to as many as 50 devices having similar parameters. Singulated semiconductor devices are characterized for compliance with certain criteria in order to determine their suitability, or lack thereof, for different potential uses. For example, devices may be separated based on operating speed wherein devices performing above a particular speed are placed in one group while devices functioning at a slower speed are placed into a different group. Carriers such as tubular magazines or bins 200 can be used to physically separate groups of devices 250 (FIG. 3). However, these carriers are unsuitable for recently developed semiconductor packages that are much-reduced in size, thickness and dimensions of individual features, such as leads for external connection to higher-level packaging.

One example of such state-of-the-art semiconductor device packages is a thin plastic package configuration identified as a Thin Small Outline Package, or TSOP. Another example is a Thin Quad Flat Pack, or TQFP. By way of comparison, such packages are dimensioned with a total package thickness, excluding lead fingers, of less than about one-half the thickness of a conventional plastic Small Outline J-lead package, or SOJ. These newer semiconductor device packages, with their smaller dimensions and more fragile components, are much more susceptible to inadvertent damage in handling than prior package designs and, at best, are only marginally robust enough for handling in tubular magazines. As a result, the industry has gravitated to processing such relatively delicate semiconductor packages in batches carried in recesses of rectangular trays, one example of which are so-called JEDEC trays 100 (FIG. 1). Other, even smaller semiconductor packages under current development and most recently introduced to the market include so-called "chip scale" semiconductor packages. These packages, having dimensions approximating those of a bare semiconductor die itself and employing extremely minute external connection elements, also are desirably handled in trays.

As stated, groups or lots of semiconductor devices or bare semiconductor dice consist of a particular device type and are selected to meet customer or industry standard specification. After sorting, semiconductor dice are typically marked as a group such that all semiconductor dice receive the same mark. Semiconductor dice generally undergo an array of testing during the manufacturing process and groups of semiconductor dice can be tracked through the fabrication, probe, assembly and test steps. However, this so-called lot-based manufacturing has several limitations including that it is inefficient, expensive, unreliable and impossible to achieve truly unique marking of semiconductor devices.

As a lot of semiconductor dice bearing the same identification number passes through manufacturing, data associated with the lot is generated and stored in association with the lot number. It is critical to track all semiconductor dice individually in a particular order so that test results can be correlated with the proper die. However, manufacturers must balance the benefit of identifying problems within individual semiconductor dice with the fact that maximum efficiency is achieved when a large number of semiconductor dice are tested in succession and problems are addressed only after the testing is complete. Accordingly, semiconductor dice are tested and results are recorded sequentially. To maintain accurate results, semiconductor dice must be placed and stored in carrier tubes in the identical order. The potential for error in lot-based manufacturing is very high as one misplaced semiconductor die or carrier results in inaccurate data association.

U.S. Pat. No. 5,856,923 to Jones et al. discloses a method of continuous nonlot-based integrated circuit manufacturing. In this process, each device from a mixed lot is provided either a substantially unique fuse ID code or marked on the lead frame with a substantially unique ID code (U.S. Pat. No. 6,049,624 Wilson et al.). The devices are processed and process-related data is generated for each individual device. Data relating to the particular device, rather than the entire lot, is stored in association with the substantially unique ID code.

U.S. Pat. No. 6,049,624 to Wilson et al. further discloses marking carrier trays or storage shelves with an ID code and storing the carrier tray ID code in association with the ID code for semiconductor dice. Semiconductor dice can be retrieved by lot number from the shelves or carrier trays.

It would be an improvement in the art to develop a technique of in-tray mapping and sequential unique marking of packaged semiconductor devices or bare semiconductor dice that eliminates the need for them to be pre-sorted.

BRIEF SUMMARY OF THE INVENTION

One embodiment of the present invention includes a method of sequential unique marking comprising providing a multi-die handling device with a plurality of packaged semiconductor devices or bare semiconductor dice therein, reading an ID code on the multi-die handling device, retrieving a tray map file corresponding to the ID code, determining a tray matrix of the multi-die handling device, retrieving data from the tray map file, the data comprising unique characters correlating to each semiconductor device or semiconductor die of the plurality of semiconductor devices or semiconductor dice and marking each semiconductor device or semiconductor die with the data.

Another embodiment of the present invention includes a method of culling semiconductor devices or bare semiconductor dice from a reject bin. The method includes retrieving a plurality of semiconductor devices or bare semiconductor dice from a reject bin, providing a plurality of multi-die handling devices having a plurality of pocket locations and assigning each multi-die handling device an ID code. Each semiconductor device or bare semiconductor die is placed in a pocket location of the plurality of pocket locations. The semiconductor devices or bare semiconductor dice are tested and a tray map file comprising test data is generated. The tray map file is stored in association with the ID code of the multi-die handling device. The method further includes reading the ID code on a multi-die handling device, retrieving the tray map file corresponding to the ID code, determining a tray matrix of the multi-die handling device, retrieving unique test data from the tray map file and marking each semiconductor device or bare semiconductor die of said plurality of semiconductor devices or bare semiconductor dice with the corresponding test data.

DETAILED DESCRIPTION OF THE INVENTION

Figure 1:
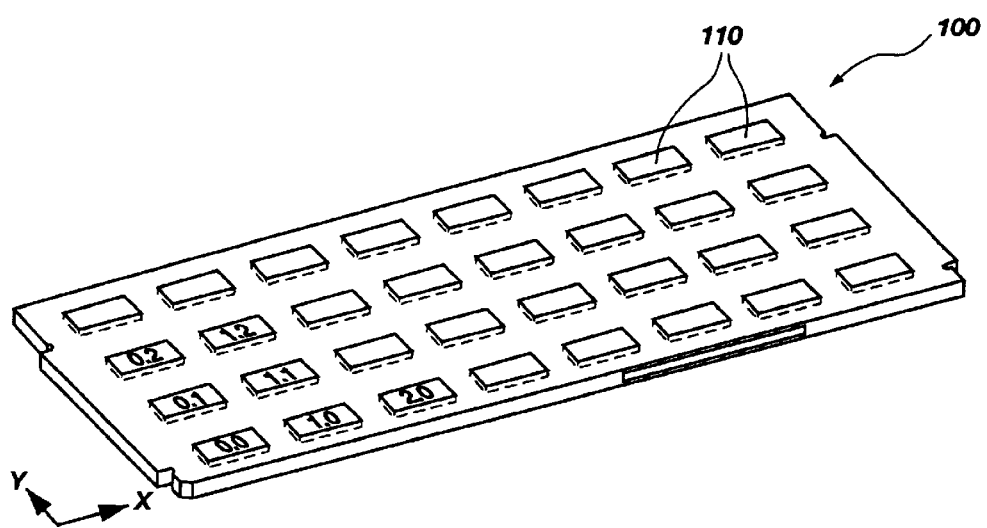
FIG. 1 illustrates a common JEDEC tray for carrying multiple devices.

Tray mapping is the logical assignment of pocket locations within the boundaries of a multi-die handling device, such as a JEDEC tray 100 shown in drawing FIG. 1. The purpose of tray mapping is to establish a correlation between the location of devices in a tray and the tray itself. This positional relationship of devices in a tray is important as it directly relates to test result data created by in-tray test equipment.

As shown in drawing FIG. 1, a JEDEC tray 100 consists of pocket locations 110 in rows and columns (X and Y-axis coordinates). Each pocket location 110 is assigned a unique coordinate number based on its X and Y-axis coordinates. In the example shown, pocket locations 110 receive a unique whole number (i.e., 1.0,2.0,3.0) corresponding to its location along the X axis and a unique fractional number (i.e., 0.1, 0.2, 0.3) corresponding to its location along the Y axis. While the current invention is described using a JEDEC tray 100, it will be understood by those of skill in the art that the invention is applicable to any multi-die handling device including multi-die handling devices having vertical carrier capabilities (e.g., a multi-die handling device that can store dice along X, Y and Z coordinates). Further, as used herein, the terns "tray," "carrier" and "multi-die handling device" are used interchangeably.

It will be further understood by those having skill in the field of this invention that the present invention is applicable to any IC device, including Dynamic Random Access Memory (DRAM) IC's, Static Random Access Memory (SRAM) IC's, Synchronous DRAM (SDRAM) IC's, processor IC's, Single In-Line Memory Modules (SIMM's), Dual In-Line Memory Modules (DIMM's), and other Multi-Chip Modules (MCM's).

The presently claimed invention includes a method of quickly placing unique characters, as well as non-unique characters, on every semiconductor device in a tray matrix. Preferably, semiconductor devices are marked by a laser having a six-inch mark field which allows a standard JEDEC tray 100 to be marked in half the amount of time. Examples of unique characters include, but are not limited to, test data extracted from a tray map file, for example, four characters [2 bytes in Hex (FAFA)] may represent test data unique to each semiconductor device in the tray.

Examples of non-unique characters include, but are not limited to, semiconductor device data (dynamic objects) and graphics (static objects) common to all the semiconductor devices in the tray. Further examples of non-unique characters include, but are not limited to, date code, semiconductor device type, country code, and company logo.

A tray map file, according to the present invention, may include a file including test data collected during in-tray testing of semiconductor dice. By way of example, semiconductor devices that do not meet specific criteria during initial processing are often discarded into reject bins and certain manufacturers are increasingly relying upon salvaging semiconductor devices from reject bins. All of the previously rejected semiconductor devices must be tested to characterize the devices and determine their suitability for use. Preferably, these semiconductor devices, from mixed lots and with unknown parameters, are placed in a multi-die handling device and tested "in-tray." Test results are preferably stored as data in a tray map file wherein the data is stored in association with a particular pocket location. Each carrier or multi-die handling device is assigned an optically readable ID code and the tray map file is stored in association with the ID code.

Figure 2:
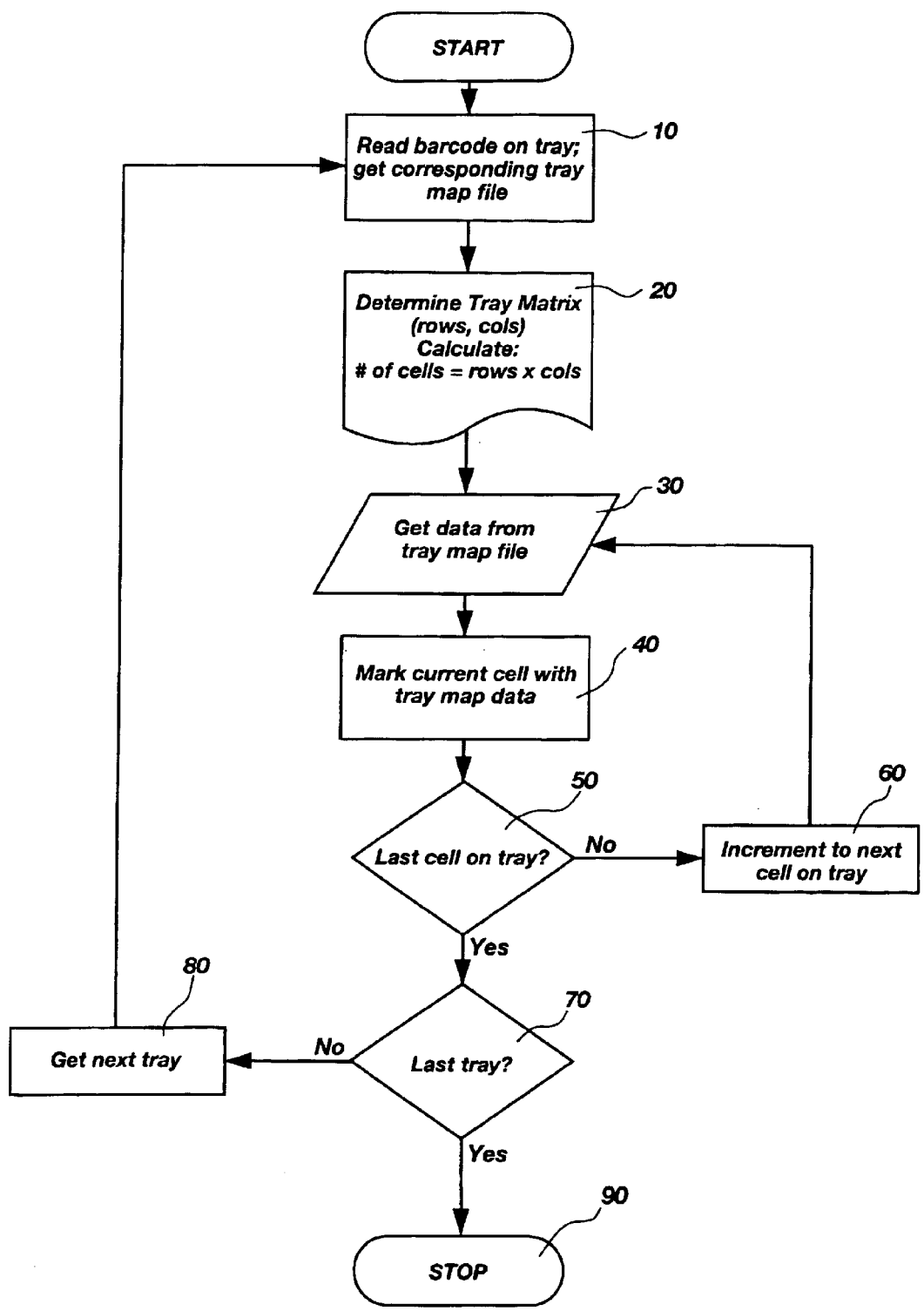
FIG. 2 is a flow chart of sequential unique marking of the present invention.
Figure 3:
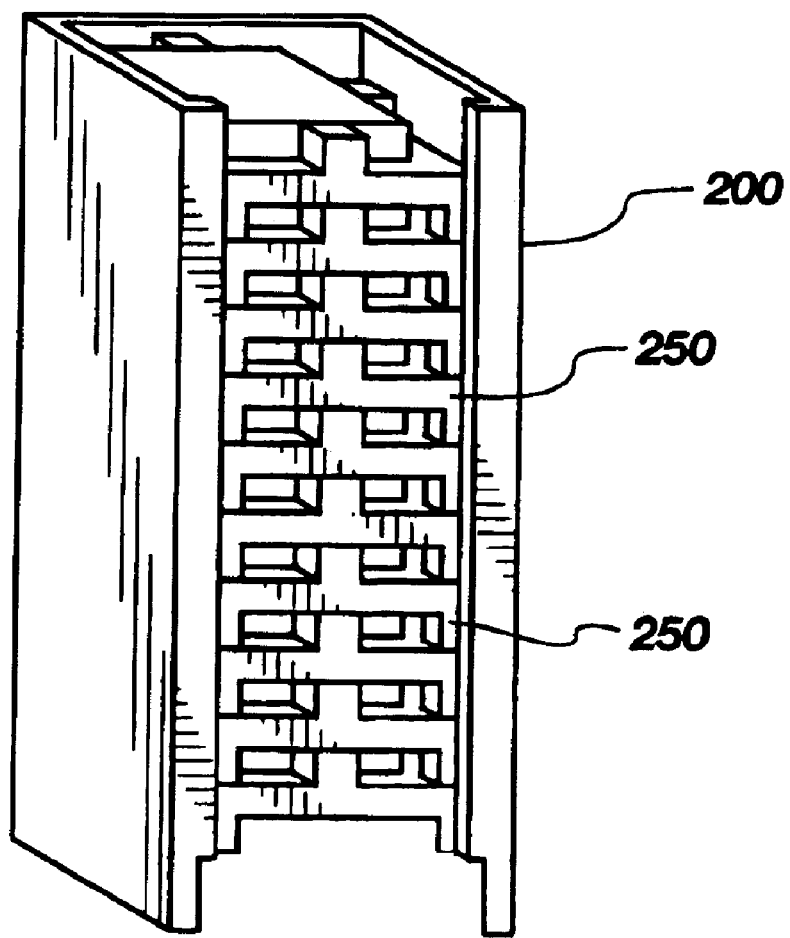
FIG. 3 illustrates a perspective view of a tray shuttle including a magazine carrier.

Illustrated in drawing FIG. 2 is a flow-chart of sequential unique marking of the current invention. The process of sequential unique marking can take place either before or after packaging of semiconductor dice. In step 10, the optically readable ID code, or barcode, on the multi-die handling device or tray is read and the corresponding tray map file is retrieved. The tray matrix and the number of cells, or pocket locations, are determined in step 20. For example, in the JEDEC tray 100 shown in drawing FIG. 1, the matrix includes rows and columns as shown by the X-axis and Y-axis. The number of cells is equal to the number of rows times the number of columns Those skilled in the art will appreciate that the step of determining the tray matrix may include a third Data from the tray map file is retrieved in step 30. As stated above, the tray map file preferably includes the results, or device parameters, of in-tray testing. The device in the current cell is marked with the tray map data in step 40. Various laser marking methods are known in the art. The methods of efficiently laser marking singulated semiconductor devices as described in U.S. Pat. Nos. 5,986,235 and 5,937,270, and assigned to the assignee of the presently claimed invention, are incorporated herein by this reference. Further, U.S. Pat. No. 6,417,484, assigned to the assignee of the present invention and hereby incorporated herein by this reference, discloses a laser marking system for dice carried in trays and method of operation.

After the semiconductor device is marked, it is determined whether the current cell is the last cell on the tray in step 50. If there is another cell on the tray, the process moves to the next cell on the tray in step 60 and steps 30 through 50 are repeated. When the last cell on the tray is reached, it is determined whether any other trays exist in step 70. If additional trays are present, steps 10 through 50 are repeated. When the last tray is reached, sequential unique marking is complete 90.

At the end of the process described, all of the semiconductor devices in a multi-die handling device receive sequential unique markings using one mark command. One advantage of the present invention is the elimination of the need to pre-sort devices before marking. By marking devices with test data, preferably related to device parameters, truly unique marking is achieved. Further, the presently claimed invention creates a "virtual binning" of devices, wherein the parameters of each semiconductor device are known and associated with a specific location within a multi-die handling device.

Although the foregoing description contains many specifics, these should not be construed as limiting the scope of the present invention but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method of unique sequential marking a plurality of semiconductor devices in a multi-die handling device comprising: reading an ID code on said multi-die handling device; retrieving a tray map file corresponding to said ID code; determining a tray matrix of said multi-die handling device; retrieving data from the tray map file, said data comprising unique characters correlating to each semiconductor device of said plurality of semiconductor devices; and marking each semiconductor device with said data.

2. The method according to claim 1, wherein said data further comprises non-unique characters.

3. The method according to claim 2, wherein said non-unique characters are selected from the group consisting of semiconductor device data, date code, country code and company logo.

4. The method according to claim 1, wherein each semiconductor device comprises an integrated circuit semiconductor device.

5. The method according to claim 4, wherein said semiconductor device each comprise a semiconductor device selected from the group consisting of Dynamic Random Access Memory (DRAM) semiconductor devices, Static Random Access Memory (SRAM) semiconductor devices, Synchronous DRAM (SDRAM) semiconductor devices, processor semiconductor devices, Single In-Line Memory Modules (SIMMs), and Dual In-Line Memory Modules (DIMMs).

6. The method according to claim 1, wherein said multi-die handling device comprises a JEDEC tray.

7. The method according to claim 1, wherein said unique characters comprise test data extracted for at least one semiconductor device from the tray map file.

8. The method of claim 1, wherein marking occurs before packaging each semiconductor device.

9. The method of claim 1, wherein marking occurs after packaging each semiconductor device.

10. A method of unique sequential marking comprising:
providing a multi-die handling device having a plurality of pockets therein in a matrix;
placing at least one semiconductor device in at least one pocket of said multi-die handling device;
reading an ID code on said multi-die handling device;
retrieving a tray map file corresponding to said ID code;
determining a tray matrix of said multi-die handling device;
retrieving data from the tray map file, said data comprising unique characters correlating to said at least one semiconductor device; and
marking said at least one semiconductor device with said data.

11. The method according to claim 10, wherein said data further comprises non-unique characters.

12. The method according to claim 11, wherein said non-unique characters comprise non-unique characters selected from the group consisting of semiconductor device data, date code, country code and company logo.

13. The method according to claim 10, wherein said at least one semiconductor device is an integrated circuit semiconductor device.

14. The method according to claim 13, wherein said semiconductor device each comprise a semiconductor device selected from the group consisting of Dynamic Random Access Memory (DRAM) semiconductor devices, Static Random Access Memory (SRAM) semiconductor devices, Synchronous DRAM (SDRAM) semiconductor devices, processor semiconductor devices, Single In-Line Memory Modules (SIMMs), and Dual In-Line Memory Modules (DIMMs).

15. The method according to claim 10, wherein said multi-die handling device comprises a JEDEC tray.

16. The method according to claim 10, wherein said unique characters comprise test data extracted from said tray map file.

17. The method of claim 10, wherein marking occurs before packaging said at least one semiconductor device.

18. The method of claim 10, wherein marking occurs after packaging said at least one semiconductor device.

19. A method of culling semiconductor devices from a reject bin, said method comprising:
retrieving a plurality of semiconductor devices from at least one reject bin;
providing at least one carrier of a plurality of carriers having a plurality of pocket locations;
assigning said at least one carrier of said plurality of carriers an ID code;
placing each semiconductor device of said plurality of semiconductor devices in a pocket location of said plurality of pocket locations;
testing each semiconductor device;
generating a tray map file comprising test data corresponding to each semiconductor device;
storing the tray map file in association with the ID code of said at least one carrier;
reading the ID code on said at least one carrier;
retrieving the tray map file corresponding to said ID code;
determining a tray matrix of said at least one carrier;

retrieving test data from the tray map file; and marking each semiconductor device of said plurality of semiconductor devices with the corresponding test data.

20. The method according to claim 19, wherein said carrier is a multi-die handling device.

21. The method according to claim 20, wherein said multi-die handling device comprises a JEDEC tray.

22. The method according to claim 19, wherein said test data comprises non-unique characters.

23. The method according to claim 22, wherein said non-unique characters comprise non-unique characters selected from the group consisting of semiconductor device data, date code, country code and company logo.

24. The method according to claim 19, wherein said semiconductor device each comprise a semiconductor device selected from the group consisting of Dynamic Random Access Memory (DRAM) semiconductor devices, Static Random Access Memory (SRAM) semiconductor devices, Synchronous DRAM (SDRAM) semiconductor devices, processor semiconductor devices, Single In-Line Memory Modules (SIMMs) and Dual In-Line Memory Modules (DIMMs).

25. The method of claim 19, wherein marking occurs before packaging each semiconductor device.

26. The method of claim 19, wherein marking occurs after packaging each semiconductor device.

27. A method of culling semiconductor devices from a reject bin, said method comprising:

retrieving a plurality of semiconductor devices from a reject bin;

providing a plurality of carriers, each carrier having a plurality of pocket locations in a tray matrix;

assigning each carrier of said plurality of carriers an ID code;

placing each semiconductor device of said plurality of semiconductor devices in a pocket location of said plurality of pocket locations;

testing each semiconductor device;

generating a tray map file comprising test data corresponding to each semiconductor device;

storing the tray map file in association with the ID code of each carrier;

reading the ID code on a carrier;

retrieving the tray map file corresponding to said ID code;

determining a tray matrix of the carrier;

retrieving test data from the tray map file; and marking each semiconductor device of said plurality of semiconductor devices with the corresponding test data.

28. The method according to claim 27, wherein said carrier comprises a multi-die handling device.

29. The method according to claim 28, wherein said multi-die handling device comprises a JEDEC tray.

30. The method according to claim 27, wherein said test data comprises non-unique characters.

31. The method according to claim 30, wherein said non-unique characters comprise non-unique characters selected from the group consisting of semiconductor device data, date code, country code and company logo.

32. The method according to claim 27, wherein said semiconductor device each comprise a semiconductor device selected from the group consisting of Dynamic Random Access Memory (DRAM) semiconductor devices, Static Random Access Memory (SRAM) semiconductor devices, Synchronous DRAM (SDRAM) semiconductor devices, processor semiconductor devices, Single In-Line Memory Modules (SIMMs), and Dual In-Line Memory Modules (DIMMs).

33. The method of claim 27, wherein marking occurs before packaging each semiconductor device.

34. The method of claim 27, wherein marking occurs after packaging each semiconductor device.

* * * * *

UNITED STATES PATENT AND TRADEMARK OFFICE
CERTIFICATE OF CORRECTION

PATENT NO. : 6,792,365 B2  
APPLICATION NO. : 09/928032  
DATED : September 14, 2004  
INVENTOR(S) : James S. Raitter It is certified that error appears in the above-identified patent and that said Letters Patent is hereby corrected as shown below:

On the title page:

| | | | |
|---|---|---|---|
| In ITEM (57) "Abstract" | | 3rd LINE, | change "of devices" to --of semiconductor devices-- |
| | | 8th LINE, | change "each device" to --each semiconductor device-- and change "of devices" to --of semiconductor devices-- |
| | | 9th LINE, | change "device with the data" to --semiconductor device with the data.-- |
| | COLUMN 3, | LINE 57, | change "(i.e., 1.0,2.0,3.0)" to --(i.e., 1.0, 2.0, 3.0)-- |
| | COLUMN 4, | LINE 4, | change "IC's," to --ICs,-- |
| | COLUMN 4, | LINE 5, | change both occurrences of "IC's," to --ICs,-- |
| | COLUMN 4, | LINE 6, | change "IC's," to --ICs,-- and change "(SIMM's)," to --(SIMMs),-- |
| | COLUMN 4, | LINE 7, | change "(DIMM's)," to --(DIMMs),-- |
| | COLUMN 4, | LINE 8, | change "(MCM's)." to --(MCMs).-- |
| CLAIM 1, | COLUMN 5, | LINE 44, | change "device with" to --device of said plurality with-- |
| CLAIM 1, | COLUMN 5, | LINES 36-44, | change the format of Claim 1 as follows: |

1. A method of unique sequential marking a plurality of semiconductor devices in a multi-die handling device comprising:
   reading an ID code on said multi-die handling device; retrieving a tray map file corresponding to said 1D code;
   determining a tray matrix of said multi-die handling device;
   retrieving data from the tray map file, said data comprising unique characters correlating to each semiconductor device of said plurality of semiconductor devices; and
   marking each semiconductor device of said plurality with said data.

UNITED STATES PATENT AND TRADEMARK OFFICE
CERTIFICATE OF CORRECTION

PATENT NO.       : 6,792,365 B2
APPLICATION NO.  : 09/928032
DATED            : September 14, 2004
INVENTOR(S)      : James S. Raitter It is certified that error appears in the above-identified patent and that said Letters Patent is hereby corrected as shown below:

| | | | |
|---|---|---|---|
| CLAIM 4, | COLUMN 5, | LINE 52, | change "device comprises" to --device of said plurality comprises-- |
| CLAIM 5, | COLUMN 5, | LINE 54, | change "wherein said" to --wherein each-- |
| CLAIM 5, | COLUMN 5, | LINE 55, | change "device each comprise" to --device of said plurality comprises-- |
| CLAIM 8, | COLUMN 6, | LINE 2, | change "device." to --device of said plurality.-- |
| CLAIM 9, | COLUMN 6, | LINE 4, | change "device." to --device of said plurality.-- |
| CLAIM 10, | COLUMN 6, | LINE 9, | change "pocket of said" to --pocket of said plurality of pockets of said-- |
| CLAIM 14, | COLUMN 6, | LINE 29, | change "wherein said" to --wherein said at least one-- |
| CLAIM 14, | COLUMN 6, | LINE 30, | change "device each comprise" to --device comprises-- |
| CLAIM 19 | COLUMN 6, | LINE 59, | change "device;" to --device of said plurality;-- |
| CLAIM 19 | COLUMN 6, | LINE 61, | change "device;" to --device of said plurality;-- |
| CLAIM 19 | COLUMN 6, | LINE 63, | change "carrier;" to --carrier of said plurality;-- |
| CLAIM 19 | COLUMN 6, | LINE 64, | change "carrier;" to --carrier of said plurality;-- |
| CLAIM 19 | COLUMN 6, | LINE 66, | change "carrier;" to --carrier of said plurality;-- |
| CLAIM 20, | COLUMN 7, | LINE 5, | change "wherein said" to --wherein said at least one-- |
| CLAIM 20, | COLUMN 7, | LINE 6, | change "carrier is" to --carrier of said plurality of carriers is-- |
| CLAIM 24, | COLUMN 7, | LINE 16 | change "semiconductor device each comprise" to --plurality of semiconductor devices each comprises-- |
| CLAIM 25, | COLUMN 7, | LINE 25, | change "device." to --device of said plurality.-- |
| CLAIM 26, | COLUMN 7, | LINE 27, | change "device." to --device of said plurality.-- |
| CLAIM 27, | COLUMN 7, | LINE 32, | change "carrier having" to --carrier of said plurality having-- |

UNITED STATES PATENT AND TRADEMARK OFFICE
CERTIFICATE OF CORRECTION

PATENT NO. : 6,792,365 B2
APPLICATION NO. : 09/928032
DATED : September 14, 2004
INVENTOR(S) : James S. Raitter It is certified that error appears in the above-identified patent and that said Letters Patent is hereby corrected as shown below:

| | | | |
|---|---|---|---|
| CLAIM 27, | COLUMN 8, | LINE 1, | change "device;" to --device of said plurality;-- |
| CLAIM 27, | COLUMN 8, | LINE 3, | change "device;" to --device of said plurality;-- |
| CLAIM 27, | COLUMN 8, | LINE 5, | change "carrier;" to --carrier of said plurality;-- |
| CLAIM 27, | COLUMN 8, | LINE 6, | change "a carrier;" to --each carrier of said plurality;-- |
| CLAIM 27, | COLUMN 8, | LINE 9, | change "the carrier;" to --each carrier of said plurality;-- |
| CLAIM 28, | COLUMN 8, | LINE 15, | change "wherein said" to --wherein each-- |
| CLAIM 28, | COLUMN 8, | LINE 16, | change "carrier comprises" to --carrier of said plurality comprises-- |
| CLAIM 32, | COLUMN 8, | LINE 25, | change "wherein said" to --wherein each-- |
| CLAIM 32, | COLUMN 8, | LINE 26, | change "device each comprise" to --device of said plurality comprises-- |
| CLAIM 33, | COLUMN 8, | LINE 35, | change "device." to --device of said plurality.-- |
| CLAIM 34, | COLUMN 8, | LINE 37, | change "device." to --device of said plurality.-- |

Signed and Sealed this

Sixth Day of November, 2007

JON W. DUDAS
*Director of the United States Patent and Trademark Office*